United States Patent
Park et al.

(10) Patent No.: US 7,241,667 B2
(45) Date of Patent: Jul. 10, 2007

(54) METHOD OF SEPARATING LAYERS OF MATERIAL

(75) Inventors: Jongkook Park, Nashua, NH (US); Jeffrey P. Sercel, Hollis, NH (US); Patrick J. Sercel, Brentwood, NH (US)

(73) Assignee: J.P. Sercel Associates, Inc., Manchester, NH (US)

( * ) Notice: Subject to any disclaimer, the term of this patent is extended or adjusted under 35 U.S.C. 154(b) by 0 days.

(21) Appl. No.: 11/215,248

(22) Filed: Aug. 30, 2005

(65) Prior Publication Data

US 2006/0003553 A1   Jan. 5, 2006

Related U.S. Application Data

(63) Continuation of application No. 11/008,589, filed on Dec. 9, 2004.

(60) Provisional application No. 60/557,450, filed on Mar. 29, 2004.

(51) Int. Cl.
  *H01L 21/20*   (2006.01)
  *B23K 26/00*   (2006.01)

(52) U.S. Cl. .............. 438/458; 219/121.8; 219/121.85; 438/463

(58) Field of Classification Search ............... 438/458, 438/462, 463; 219/121.8, 121.85
See application file for complete search history.

(56) References Cited

U.S. PATENT DOCUMENTS

| | | |
|---|---|---|
| 3,808,550 A | 4/1974 | Ashkin .................. 331/94.5 |
| 3,959,045 A | 5/1976 | Antypas |
| 4,345,967 A | 8/1982 | Cook .................... 156/613 |
| 4,396,456 A | 8/1983 | Cook .................... 156/602 |
| 4,448,636 A | 5/1984 | Baber .................... 156/643 |
| 4,774,194 A | 9/1988 | Hokuyou ................... 437/5 |
| 4,846,931 A | 7/1989 | Gmitter et al. .......... 156/633 |
| 4,883,561 A | 11/1989 | Gmitter et al. .......... 156/633 |
| 5,122,845 A | 6/1992 | Manabe et al. ............ 357/17 |
| 5,151,389 A * | 9/1992 | Zappella ................. 438/463 |
| 5,171,712 A | 12/1992 | Wang et al. |
| 5,237,182 A | 8/1993 | Kitagawa et al. .......... 257/15 |
| 5,262,347 A | 11/1993 | Sands |

(Continued)

FOREIGN PATENT DOCUMENTS

DE           3508469           11/1986

(Continued)

OTHER PUBLICATIONS

Yablonovitch et al., "Extreme selectivity in the lift-off of epitaxial GaAs films", *Applied Physics Letters* vol. 51, No. 26, Dec. 28, 1987, (3 pgs).

(Continued)

*Primary Examiner*—Geoffrey S. Evans
(74) *Attorney, Agent, or Firm*—Grossman Tucker Perreault & Pfleger, PLLC

(57) ABSTRACT

A lift off process is used to separate a layer of material from a substrate by irradiating an interface between the layer of material and the substrate. According to one exemplary process, the layer is separated into a plurality of sections corresponding to dies on the substrate and a homogeneous beam spot is shaped to cover an integer number of the sections.

23 Claims, 11 Drawing Sheets

U.S. PATENT DOCUMENTS

| | | | |
|---|---|---|---|
| 5,286,335 A | 2/1994 | Drabik et al. | |
| 5,290,393 A | 3/1994 | Nakamura | 156/613 |
| 5,369,289 A | 11/1994 | Tamaki et al. | 257/99 |
| 5,374,564 A | 12/1994 | Bruel | 437/24 |
| 5,376,580 A | 12/1994 | Kish et al. | 437/127 |
| 5,391,257 A | 2/1995 | Sullivan et al. | 156/630 |
| 5,401,983 A | 3/1995 | Jokerst et al. | |
| 5,413,951 A | 5/1995 | Ohori et al. | 437/61 |
| 5,453,405 A | 9/1995 | Fan et al. | 437/228 |
| 5,465,009 A | 11/1995 | Drabik et al. | 257/723 |
| 5,523,589 A | 6/1996 | Edmond et al. | 257/77 |
| 5,552,345 A | 9/1996 | Schrantz et al. | 437/227 |
| 5,559,043 A | 9/1996 | Bruel | 437/24 |
| 5,679,152 A | 10/1997 | Tischler et al. | 117/97 |
| 5,776,794 A | 7/1998 | McCann | |
| 5,827,751 A | 10/1998 | Nuyen | 438/28 |
| 5,834,325 A | 11/1998 | Motoki et al. | 438/22 |
| 5,837,561 A | 11/1998 | Kish, Jr. et al. | 438/47 |
| 5,846,844 A | 12/1998 | Akasaki et al. | 437/21 |
| 5,874,147 A | 2/1999 | Bojarczuk et al. | 428/64.1 |
| 5,882,987 A | 3/1999 | Srikrishana et al. | 438/458 |
| 5,920,764 A | 7/1999 | Hanson et al. | 438/4 |
| 5,926,740 A | 7/1999 | Forbes et al. | 438/763 |
| 5,966,622 A | 10/1999 | Levine et al. | 438/459 |
| 5,985,687 A | 11/1999 | Bowers et al. | 438/46 |
| 6,013,534 A | 1/2000 | Mountain | |
| 6,013,567 A | 1/2000 | Henley et al. | 438/515 |
| 6,027,988 A | 2/2000 | Cheung et al. | |
| 6,033,995 A | 3/2000 | Muller | |
| 6,036,809 A | 3/2000 | Kelly et al. | 156/247 |
| 6,071,795 A | 6/2000 | Cheung et al. | 438/458 |
| 6,113,685 A | 9/2000 | Wang et al. | 117/3 |
| 6,159,824 A | 12/2000 | Henley et al. | 438/455 |
| 6,210,479 B1 | 4/2001 | Bojarczuk et al. | 117/84 |
| 6,214,733 B1 | 4/2001 | Sickmiller | |
| 6,300,594 B1 * | 10/2001 | Kinoshita et al. | 219/121.69 |
| 6,335,263 B1 | 1/2002 | Cheung et al. | |
| 6,410,942 B1 | 6/2002 | Thibeault et al. | |
| 6,413,839 B1 * | 7/2002 | Brown et al. | 438/463 |
| 6,417,019 B1 | 7/2002 | Mueller et al. | |
| 6,420,242 B1 | 7/2002 | Cheung et al. | 438/458 |
| 6,425,971 B1 * | 7/2002 | Silverbrook | 438/464 |
| 6,448,102 B1 | 9/2002 | Kneissl et al. | 438/46 |
| 6,548,386 B1 | 4/2003 | Kondo et al. | |
| 6,559,075 B1 | 5/2003 | Kelly et al. | 438/795 |
| 6,617,261 B2 * | 9/2003 | Wong et al. | 438/778 |
| 6,645,830 B2 * | 11/2003 | Shimoda et al. | 438/458 |
| 6,740,604 B2 | 5/2004 | Kelly et al. | 438/795 |
| 6,746,889 B1 | 6/2004 | Eliashevich et al. | 438/33 |
| 6,818,530 B2 * | 11/2004 | Shimoda et al. | 438/458 |
| 6,858,872 B2 | 2/2005 | Kondo | |
| 6,902,989 B2 * | 6/2005 | Na et al. | 438/463 |
| 6,949,449 B2 * | 9/2005 | Swenson et al. | 438/463 |
| 7,015,117 B2 * | 3/2006 | Urbanek | 438/458 |
| 2003/0104678 A1 * | 6/2003 | Kelly et al. | 438/458 |
| 2004/0072382 A1 | 4/2004 | Kelly et al. | 438/46 |
| 2005/0106839 A1 * | 5/2005 | Shimoda et al. | 438/458 |
| 2005/0153525 A1 * | 7/2005 | Liu | 438/463 |

FOREIGN PATENT DOCUMENTS

| | | |
|---|---|---|
| DE | 10203795 | 8/2003 |
| DE | 10203795 A1 * | 8/2003 |

OTHER PUBLICATIONS

C.R. Miskys et al., "MOCVD-Epitaxy on Free-Standing HVPE-GaN Substrates", *Physica Status Solidi* (a) 176, 443, (1999), (4pgs).

Morimoto, "Few Characteristics of Epitaxial GaN-Etching and Thermal Decomposition", *J. Electrochem. Soc.: Solid-State Science and Technology*, Oct. 1974, (2 pgs).

Groh et al., "On the Thermal Decomposition of GaN in Vacuum", *Physica Status Solidi* (a) 26, 353, (1974), (5 pgs).

Leonard et al., "Photoassisted Dry Etching of GaN", *Applied Physics Letters* vol. 68, Feb. 5, 1996, (3 pgs).

Fastenau et al., "Epitaxial Lift-Off of Thin InAs Layers", *Journals of Electronic Materials* vol. 24, No. 6, (1995), (4 pgs).

Nakamura, "GaN Growth using GaN Buffer Layer", *Japanese Journal of Applied Physics*, vol. 30, (1991), (3 pgs).

Ruby, "Micromachined Cellular Filters", *IEEE MTT-S Digest*, (1996), (4 pgs).

Ruby, "Micromachined Thin Film Bulk Acoustic Reasonaters", *IEEE*, (1994).

Yablonovitch et al., "Van der Waals bonding of GaAs on Pd Leads to a permanent solid-phase-topotaxial, metallurgical bond", *Applied Physics Letters* vol. 59, No. 24, (1991), (3 pgs).

Detchprohm et al., "The growth of thick GaN film on sapphire substrate by using ZnO buffer layer", *Journal of Crystal Growth*, vol. 128, Nos. 1-4, (1993), (7 pgs).

Bohandy et al., "Metal deposition from a supported metal film using an excimer laser", *Journal of Applied Physics* vol. 60, No. 4, Aug. 1986, (2 pgs).

International Search Report with Written Opinion, mailed Aug. 1, 2006, received in corresponding PCT application (12 pages).

Lewelling, et al., "Finite-Element Modeling Predicts Possibility of Thermoelectrically Cooled Lead-Salt Diode Lasers" IEEE Photonics Technology Letters, vol. 9, No. 3, Mar. 1997, pp. 297-299 (3 pages).

McAlister, et al., "Fabrication of Thin-Film Cleaved Cavities Using a Bonding and Cleaving Fixture" IEEE Photonics Technology Letters, vol. 12, No. 1, Jan. 2000, pp. 22-24 (3 pages).

Riegler, et al., "Index Matching Silicone for High Brightness LED Packaging" NuSil Technology (9 pages).

UC Berkley, "Laser Lift-off & Film Transfer" article last updated Jun. 19, 2002 (4 pages).

Wong, et al., "Selective UV-Laser Processing for Lift-off of GaN Thin Films From Sapphire Substrates" Proceedings of the Symposium on LED for Optoeclectronic Applications and the 28th State of the Art Programs on Compound Semiconductors 98-2, 377, 1998 (8 pages).

Kelly, et al., "Optical Process for Liftoff of Group III-Nitride Films", Rapid Research Note article, submitted Nov. 28, 1996 (8 pages).

Kelly, et al., "Laser-Processing For Patterned and Free-Standing Nitride Films", Materials Research Society, vol. 482, pp. 973-978, 1998 (6 pages).

Peyre, et al., "Laser shock processing of materials, physical processes involved and examples of applications", Journal of Laser Applications, 1996 (7 pages).

Fabbro, et al., "Physical study of laser-produced plasma in confined geometry", Journal of Applied Physics, vol. 68 No. 2, Jul. 15, 1990 (10 pages).

Sameshima, "Laser beam application to thin film transistors", Applied Surface Science, 1997 (7 pages).

Wong, et al., "Pulsed Excimer Laser Processing of AlN/GaN Thin Films", Materials Research Society Symposium Proceedings, vol. 449, 1997 (6 pages).

Kelly, et al., "Large Free-Standing GaN Substrates by Hydride Vapor Phase Epitaxy and Laser-Induced Liftoff", Japanese Journal of Applied Physics, vol. 38, Mar. 1, 1999 (3 pages).

Wong, et al., "Fabrication of thin-film InGaN light-emitting diode membranes by laser lift-off", Applied Physics Letters, vol. 75 No. 10, Sep. 6, 1999 (3 pages).

Deng, et al., "Fabrication of Ultra-small Dimention SI1-xGEx Wires in SI Using Pulsed Laser Induced Epitaxy", Department of Electrical Engineering and Applied Physics, pp. 444-446 (3 pages).

Wong, et al., "InxGa-1-xN light emitting diodes on Si substrates fabricated by Pd-In metal bonding and laser lift-off", Applied Physics Letters, vol. 77 No. 18, Oct. 30, 2000 (3 pages).

Wong, et al., "Ubiquitous Blue Light: The Integration of InGaN-based Optoelectronics with Dissimilar Substrates by Wafer Bonding and Laser Lift-off" IEEE 2000 (6 pages).

Wong, et al., "Damage-free separatioin of GaN thin films from sapphire substrates", Applied Physics Letters, vol. 72 No. 5, Feb. 2, 1998 (3 pages).

Luo, et al., "Enhancement of (In,Ga) N Light-Emitting Diode Performance by Laser Liftoff and Transfer From Sapphire to Silicon", IEEE Photonics Technology Letters, vol. 14 No. 10, Oct. 2002 (3 pages).

Oriol Inc. (News Release) "Breakthrough in Vertical GaN LEDs Announced by High Brightness LED Startup Oriol, Inc." Apr. 30, 2002 (2 pages).

Detchprohm, et al., "The growth of thick GaN film on sapphire substrate by using ZnO buffer layer", Journal of Crystal Growth, vol. 128 No. 1-4, Mar. 1993 pp. 384-390 (7 pages).

Sink, et al., "Cleaved GaN facets water fusion of GaN to InP", Applied Physics Letters, vol. 68 No. 15, Apr. 8, 1996 (3 pages).

Kelly, et al., "Optical patterning of GaN films", Applied Physics Letters, vol. 69 No. 12, Sep. 16, 1996 (3 pages).

* cited by examiner

FIG. 9
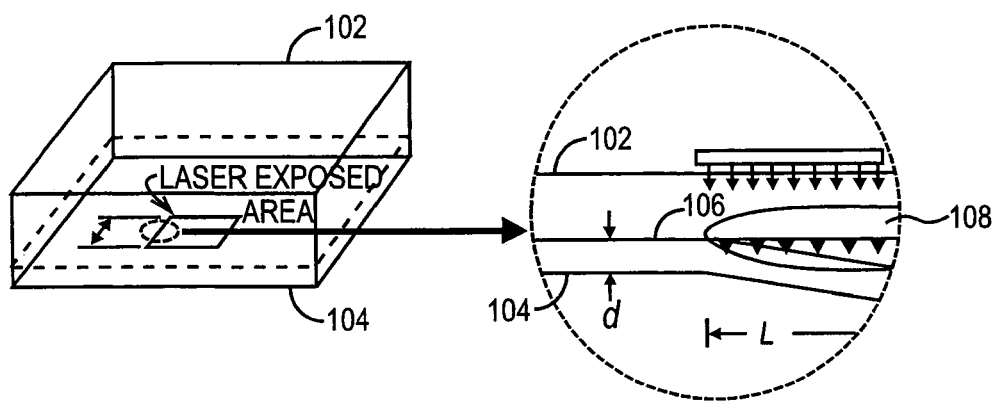
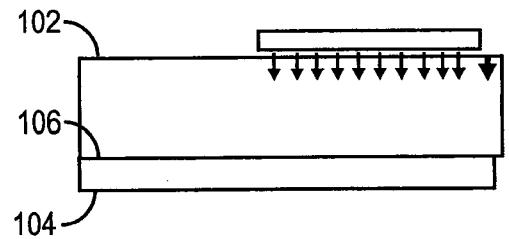
FIG. 10A
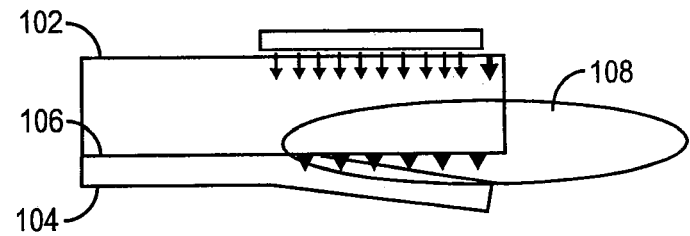
FIG. 10B
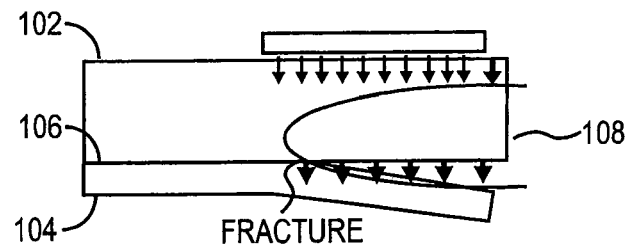
FIG. 10C

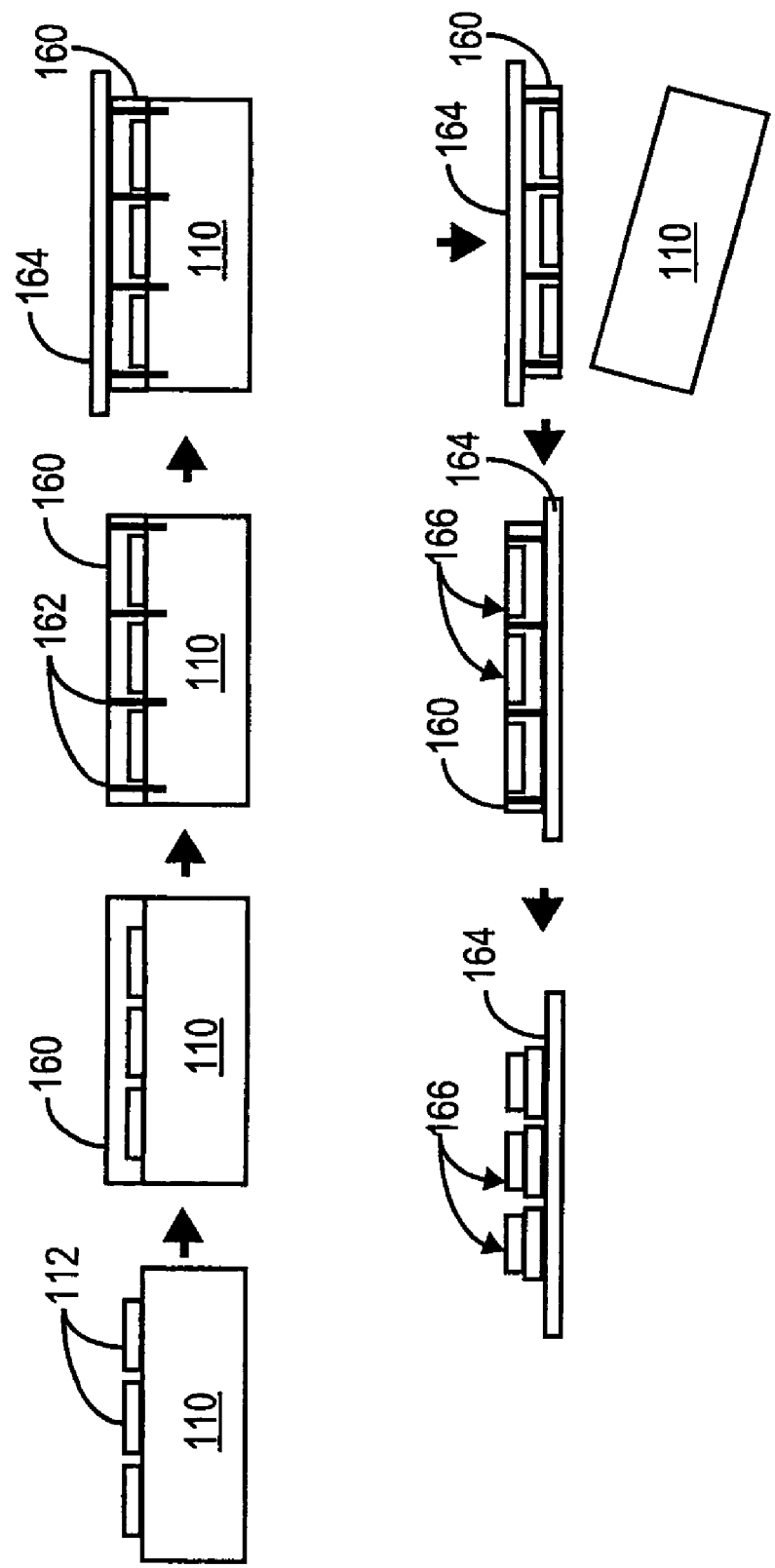

though the sapphire. Some of light directed towards the sapphire substrate 14 is reflected to the front surface due to the difference in refractive indices between the sapphire wafer and its surroundings. The Ni/Au thin film 16 absorbs the majority of this reflected output light as well.

METHOD OF SEPARATING LAYERS OF MATERIAL

CROSS-REFERENCE TO RELATED APPLICATIONS

This application is a continuation of co-pending U.S. patent application Ser. No. 11/008,589 filed Dec. 9, 2004, pending, which claims the benefit of co-pending U.S. Provisional Patent Application Ser. No. 60/557,450, filed on Mar. 29, 2004, which is fully incorporated herein by reference.

TECHNICAL FIELD

The present invention relates to separation of layers of material and more particularly, to separation of layers of material, such as a substrate and a film grown on the substrate, by irradiating an interface between the layers.

BACKGROUND INFORMATION

GaN/InGaN-based Light-Emitting Diodes (LEDs), known as "Blue LEDs," have a promising future. Practical applications for these GaN/InGaN-based LEDs have been expanding to include such products as mobile phone keypads, LCD backlights, traffic lights, commercial signs, automotive lights, outdoor full-color display panels, household illuminative devices, and others. In these and other applications, these high-brightness LEDs may replace conventional light sources such as incandescent and fluorescent lights. Blue LEDs are characterized by high light output at lower energy input than conventional light sources (energy saving, high efficiency) and a longer working life. Their high performance and reliability shows promise for their successful replacement of conventional light sources; however, there is a need to improve current LED designs to overcome currently-known limitations and inherent drawbacks. Better and more precise manufacturing techniques help advance blue LED design by cutting waste, increasing yields, and allowing more advanced and complex or improved designs to emerge, advancing the technology through more flexibility in Design for Manufacturability (DFM). Such improved manufacturing techniques simplify and reduce the cost of their manufacture.

Blue LED's may be fabricated by depositing GaN/InGaN layer(s) on a sapphire substrate. Once the LED devices have been fabricated, the wafer is separated into individual dies. One current die separation process involves the following steps. First the sapphire wafer is thinned to less than 100 μm in thickness by grinding and lapping the backside of the wafer. Next the wafer is mounted to dicing tape and then scribed along the streets between the die by means of a diamond scribe tip or UV laser beam. Finally, the wafer is fractured along the scribe lines by means of a fracturing tool. After fracturing, the dicing tape is stretched so as to physically separate the die from one another so that subsequent automated pick and place operations can be performed. This process is referred to as "scribe and break" die separation.

A major cost of LED fabrication is the sapphire thinning and the scribe-and-break operation. A process known as LED lift-off can dramatically reduce the time and cost of the LED fabrication process. LED lift-off may eliminate wafer scribing by enabling the manufacturer to grow GaN LED film devices on the sapphire wafer, for example, and then transfer the thin film device to a heat sink electrical interconnect. In this process, the laser beam profile fires through the back of a sapphire wafer to de-bond the GaN LED device and transfer it to a substrate where it can then be packaged onto a heat sink and/or optical reflector. Using special wafers, the sapphire growth substrate may possibly be re-used, and the cost of LED fabrication can be reduced. Additionally, this approach is fast, delivering increased LED light output, and has low operating costs due to low stress on the UV laser.

Current designs of GaN LEDs have inherent limitations that hamper efforts to improve performance and reliability. The designs have also been associated with electrostatic discharge problems. As shown in FIGS. 1A and 1B, a blue LED 10 may include multiple InGaN and GaN based layers 12a, 12b, 12c which are hetero-epitaxially grown on a silicon carbide or a sapphire wafer substrate 14. Since the sapphire wafer is a natural insulator, current is supplied by a horizontal electrode configuration. Due to the high resistance of the p-GaN layer 12a, a thin film of Ni/Au 16 is deposited over the p-GaN to promote current dispersion spreading. However, there are some drawbacks associated with the horizontal configuration.

First, the Ni/Au film 16 absorbs a substantial portion of the LED light output. The Ni/Au film 16 is very thin (usually less than 100 Å), in order to make it transparent to LED light, since it has limited transmittance to the emitting light. Approximately 25% of the light emitted by the LED itself is absorbed by the Ni/Au film 16. Furthermore, a significant percentage of the emitted light is lost in transmission through the sapphire. Some of light directed towards the sapphire substrate 14 is reflected to the front surface due to the difference in refractive indices between the sapphire wafer and its surroundings. The Ni/Au thin film 16 absorbs the majority of this reflected output light as well.

Secondly, the Ni/Au film 16 is sensitive to moisture, resulting in performance degradation over time. To maintain the film's transparency, thin Ni/Au is deposited by metal evaporation, and then heat-treated in an ambient air or an $O_2$ environment. The Ni/Au film 16 forms an oxidized compound, $NiO_x$ with an Au-rich structure. When moisture penetrates to the oxide film over long-term operation, the LED device 10 will be damaged.

Third, the Ni/Au film 16 experiences a degradation in the performance efficiency of the InGaN MQW light-emitting layer 12b due to a current crowding effect. Since the current spreading Ni/Au film 16 has lower resistance than the n-GaN layer 12c, the current may crowd in the region 18 near the n (−) electrode 20 (see FIG. 1A). Thus, the phenomenon of current crowding may prevent homogeneous use of the active InGaN area, resulting in low efficiency of light output and low reliability due to uneven use of the active area.

Fourth, the horizontal-electrode configuration may create the effect of a current bottleneck, resulting in low reliability. The current supplied through the p (+) electrode 22 spreads across the Ni/Au film 16, and flows from p-GaN 12a through InGaN 12b to n-GaN 12c. Since the n (−) electrode 20 is horizontally located at the n-GaN 12c, the current is bottlenecked in the area 24 at the electrode 20 (FIGS. 1A and 1B).

A LED structured with a vertical electrode configuration overcomes many of the drawbacks of the horizontal LED structure. As shown in FIG. 2, an LED 30 with a vertical structure involves a transfer of GaN layers 32a, 32b, 32c from the sapphire substrate to a conductive substrate 34, such as a silicon wafer. The vertical electrode configuration may eliminate the Ni/Au film, which substantially increases light output. The vertical structure allows the deposition of a metal reflection layer 36, which minimizes light loss through the sapphire in the horizontal structure. The vertical structure also improves reliability and performance by reducing or eliminating the current crowding and bottle neck. A factor in constructing the vertical LED structure is the successful lift-off process of the GaN layer from the epitaxial sapphire wafer to the conductive silicon wafer.

One example of the construction of a high-brightness vertical LED is show in FIG. 3. First, GaN layers 32a, 32c are deposited onto a sapphire wafer 38. After a metal thin-film reflector 36 is deposited on the p-GaN, then a Si substrate, or any other conductive substrate 34 (including GaAs substrate and thick metal films) is bonded over the metal thin-film reflector. The sapphire wafer is removed by UV-laser lift-off, as described below. The n (−) electrode is deposited on the n-GaN layer and the p (+) electrode is deposited on the Si wafer. Since the n-GaN layer has lower resistance than the p-GaN layer, the thin Ni/Au film is no longer needed. Current is therefore more evenly spread without crowding or a bottleneck effect. Elimination of the troublesome Ni/Au thin film results in an increase in performance and reliability of LEDs with the vertical structure.

The vertical structure may be created using a UV-laser lift off process. One approach to UV-laser lift-off involves the selective irradiation of the GaN/Sapphire interface with a UV laser pulse, utilizing the absorption difference of UV light between the GaN (high absorption) thin film layers and the sapphire substrate. Commonly, the GaN layers are hetero-epitaxially grown on a sapphire wafer. To facilitate GaN crystal growth, a buffer layer may be deposited at a relatively low temperature, around 300° C. While the buffer layer helps to grow the GaN layer at a high temperature, the buffer layer contains a very high density of various defects due to a large lattice mismatch. The crystal defects, such as dislocations, nanopipes and inversion domains, elevate surface energy which consequently increases absorption of incident UV light. The incident laser beam for the lift-off process carries an energy density well below the absorption threshold of the sapphire wafer, allowing it to transmit through without resulting in any damage. In contrast, the laser energy density is high enough to cause photo-induced decomposition at the interface, which allows debonding of the interface.

Studies exist regarding the UV laser lift-off process. Kelly et al. demonstrated decomposition of GaN by laser irradiation through transparent sapphire, using a Q-switched Nd:YAG laser at 355 nm. (see M. K Kelly, O. Ambacher, B. Dalheimer, G. Groos, R. Dimitrov, H. Angerer and M. Stutzmann, *Applied Physics Letter*, vol. 69p. 1749, 1996). Wong et al. used a 248 nm excimer laser to achieve separation of ~5 µm thin GaN film from a sapphire wafer (see W. S. Wong, T. Sands and N. W. Cheung, *Applied Physics Letter*, vol. 72 p. 599, 1997). Wong et al. further developed the lift-off process on GaN LED using a 248 nm excimer laser (see W. S. Wong, T. Sands, N. W. Cheung, M. Kneissl, D. P. Bour, P. Mei, L. T. Romano and N. M. Johnson, *Applied Physics Letters*, vol. 75 p. 1360, 1999). Kelly et al. also demonstrated the lift-off of 275 µm thick, free-standing GaN film using a raster scanning of Q-switched 355 nm Nd:YAG laser (see M. K. Kelly, R. P. Vaudo, V. M. Phanse, L. Gorgens, O. Ambacher and M. Stutzmann, Japanese Journal of Applied Physics, vol. 38 p. L217, 1999). Kelly et al. also reported their difficulty in overcoming extensive fracturing of GaN thick film upon the laser lift-off process, due to high residual stresses from a GaN-sapphire wafer. Id. In this study, the authors had to heat the GaN/sapphire wafer to 600° C., but they could not completely offset the fracturing problems caused by the residual stresses.

In spite of the advantages from UV-laser lift-off, GaN LED manufacturing has been limited due to poor productivity caused by low process yield. The low yield is due in part to high residual stresses in a GaN-sapphire wafer, resulting from a Metal-Organic Chemical Vapor Deposit (MOCVD) process. The MOCVD process requires an activation temperature of over 600° C. As shown in FIG. 4A, GaN and InGaN layers 32 are deposited on a sapphire wafer 38 by the MOCVD process. Since there is substantial difference in coefficients of thermal expansion (CTE) between the GaN ($5.59 \times 10-6/°$ K.) and the sapphire ($7.50 \times 10-6/°$ K.) (see Table 1), high levels of residual stresses exist when the GaN/sapphire wafer cools down to ambient temperature from the high temperature of the MOCVD process, as shown in FIG. 4B. The residual stresses include compressive residual stresses 40 on the GaN and tensional residual stresses 42 on the sapphire.

TABLE 1

Various material properties of GaN and sapphire.

| Material | Structure | Lattice Const. a (Å) | Lattice Const. c (Å) | Density (g/cm$^3$) | Band Gap Energy (eV) | Thermal Expansion $\times 10^{-6}/°$ K |
|---|---|---|---|---|---|---|
| Sapphire | Hexagonal | 4.758 | 12.991 | 3.97 | 9.9 | 7.50 |
| GaN | Hexagonal | 3.189 | 5.815 | 6.1 | 3.3 | 5.59 |

When an incident laser pulse with sufficient energy hits a GaN/sapphire interface, the irradiation results in instantaneous debonding of the interface. Since the incident laser pulse has limited size (usually far less than 1 cm$^2$), it creates only a small portion of the debonded or lifted-off interface. Since surroundings of the debonded area still have high level of residual stress, it creates a concentration of stress at the bonded/debonded border, resulting in fractures at the border. This fracturing, associated with the residual stress, has been one of the obstacles of the UV-laser lift-off process.

Currently, there are different ways to perform laser lift-off processes on GaN/sapphire wafers. One method involves raster scanning of a Q-switched 355 nm Nd:YAG laser (see, e.g., M. K. Kelly, R. P. Vaudo, V. M. Phanse, L. Gorgens, O. Arribacher and M. Stutzmann, Japanese Journal of Applied Physics, vol. 38 p. L217, 1999). This lift-off process using a solid state laser is illustrated in FIG. 5A. Another method uses a 248 nm excimer laser (see, e.g., W. S. Wong, T. Sands, N. W. Cheung, M. Kneissl, D. P. Bour, P. Mei, L. T. Romano and N. M. Johnson, Applied Physics Letters, vol. 75 p. 1360, 1999). This lift-off process using an excimer laser is illustrated in FIG. 5B.

Both processes employ raster scanning, as shown in FIG. 6, which involves either translation of the laser beam 44 or the target of the GaN/sapphire wafer 46. A problem associated with the raster scanning method is that it requires overlapping exposures to cover the desired area, resulting in multiple exposures 48 for certain locations. In both of the above methods, the laser lift-off of GaN/sapphire is a single pulse process. The unnecessary multiple exposures in localized areas increase the potential for fracturing by inducing excessive stresses on the film.

As shown in FIG. 7, raster scanning also involves a scanning of the laser beam 44 from one end to the other, gradually separating the GaN/sapphire interface from one side to the other. This side-to-side relaxation of residual stresses causes large differences in the stress level at the interface 50 between the separated and un-separated regions, i.e., the interface between the scanned and the un-scanned area. The disparity in residual stress levels at the interface 50 increases the probability of propagation of Mode I and Mode II cracks. Although the illustrations in FIGS. 6 and 7 are based on a process using a solid state laser, raster scanning of an excimer laser will produce similar results.

Currently, a common size of sapphire wafers is two-inch diameter, but other sizes (e.g., three-inch and four-inch wafers) are also available for the hetero-epitaxial growth of GaN. For a GaN/sapphire wafer, the level of residual stresses varies in the wafer, and compressive and tensile residual stresses may exist together. The existence of the residual stresses may be observed by wafer warping or bowing. When a laser lift-off process relaxes a large area of a continuous GaN/sapphire interface, as described above, a severe strain gradient may be developed at the border between the debonded and the bonded interface. This strain gradient may cause extensive fracturing of the GaN layer.

When a target material is irradiated with an intense laser pulse, a shallow layer of the target material may be instantaneously vaporized into the high temperature and high pressure surface plasma. This phenomenon is called ablation. The plasma created by the ablation subsequently expands to surroundings. The expansion of the surface plasma may induce shock waves, which transfer impulses to the target material. The ablation may be confined in between two materials when the laser is directed through a transparent material placed over the target. During this confined ablation, the plasma trapped at the interface may create a larger magnitude of shock waves, enhancing impact pressures. The explosive shock waves from the confined ablation at the GaN/sapphire interface can cause not only separation of the GaN layer from the sapphire substrate but may also fracture the GaN layer near the laser beam spot (see, e.g., P. Peyre et. al., Journal of Laser Applications, vol. 8 pp. 135–141, 1996).

Accordingly, there is a need for an improved method of separating GaN thin films from a sapphire wafer by addressing the problems associated with residual stress, which lead to low yields due to the fracturing of separated film layers. There is also a need for processes that can be extended to any lift-off applications to address one or more of the problems discussed above.

BRIEF DESCRIPTION OF THE DRAWINGS

These and other features and advantages will be better understood by reading the following detailed description, taken together with the drawings wherein:

FIG. 9 is a schematic diagram illustrating a laser exposed area and cross-section of the separation of the layers, consistent with one embodiment of the present invention.

FIGS. 10A–10C are schematic diagrams illustrating the effects of different laser energy densities.

FIG. 20 is a diagram illustrating a laser lift-off process, consistent with yet a further embodiment of the present invention.

DETAILED DESCRIPTION

This detailed description describes exemplary embodiments of processes consistent with the present invention, which address the problems associated with existing lift-off processes and increase productivity. Applications of the invention are not limited to the following exemplary embodiments. Although the exemplary embodiments refer to GaN and sapphire and the GaN/sapphire interface, other types of substrates and layers of material may be used which are known to those skilled in the art. Also, a sacrificial layer can be provided between the GaN (or other layer of material) and the sapphire (or other type of substrate).

Figure 1A:
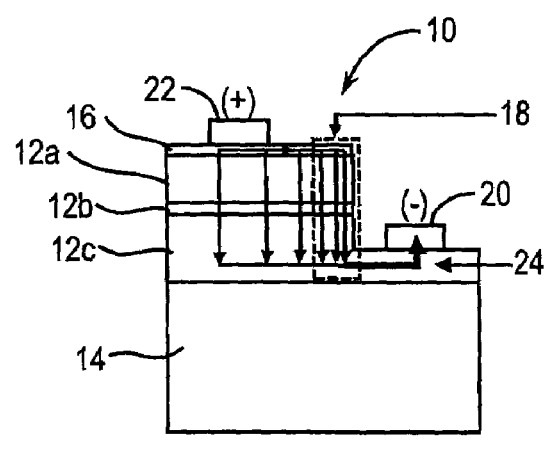
FIG. 1A is a schematic diagram illustrating a cross section of a conventional GaN LED with a horizontal electrode configuration.
Figure 1B:
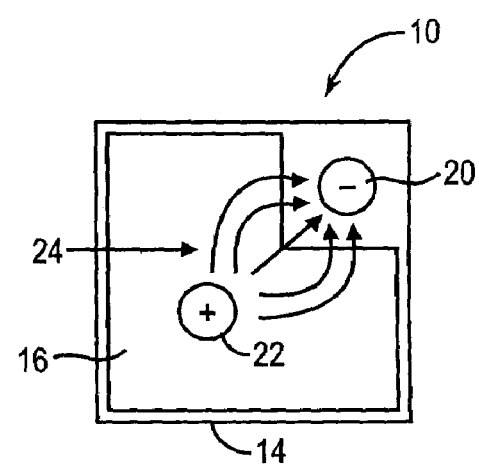
FIG. 1B is a top view of the GaN LED shown in FIG. 1A.
Figure 2:
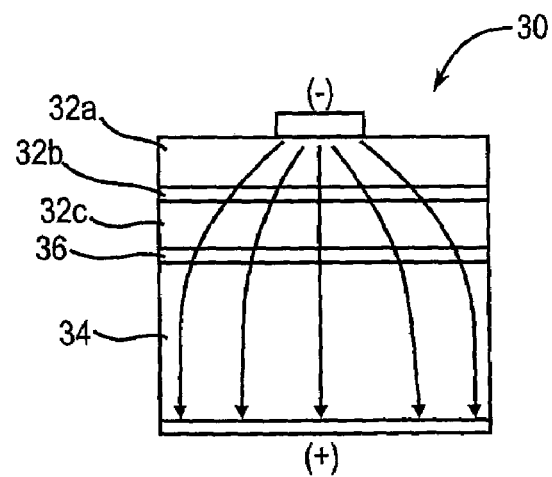
FIG. 2 is a schematic diagram illustrating a cross section of a GaN LED with a vertical electrode configuration.
Figure 3:
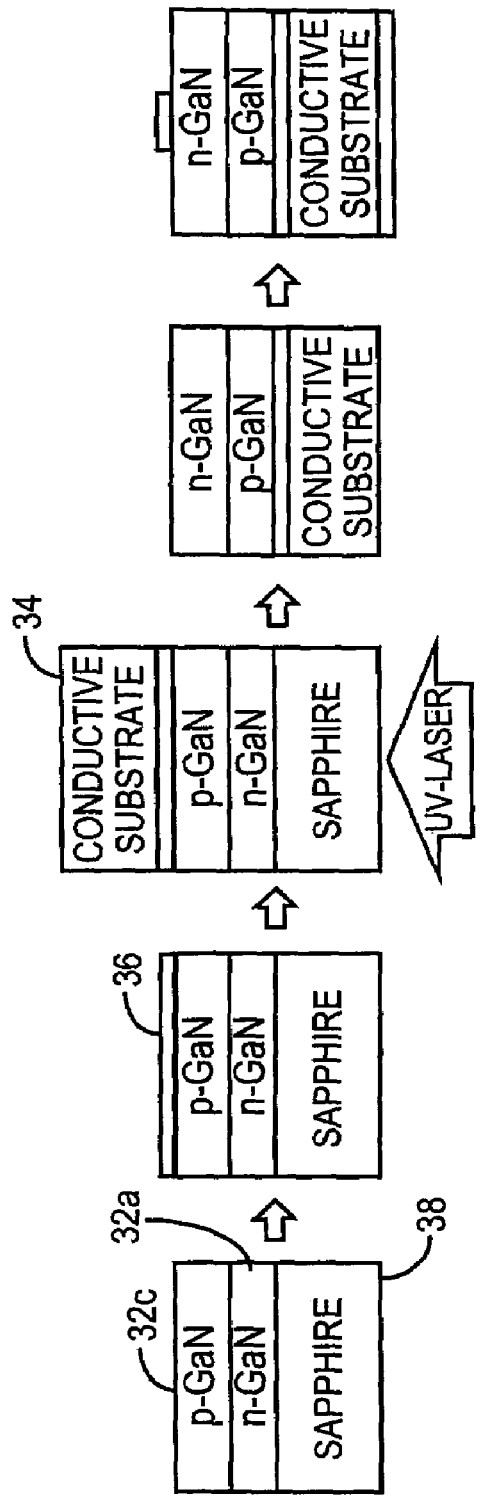
FIG. 3 is a flow diagram illustrating construction of a GaN LED with a vertical electrode configuration.
Figure 4B:
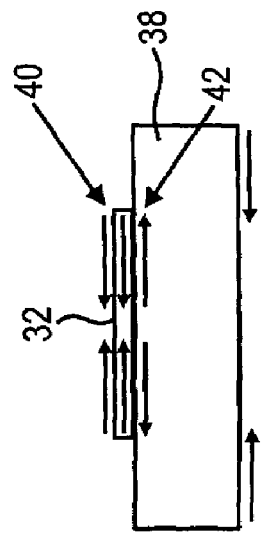
FIG. 4B is a schematic diagram illustrating formation of residual stresses on a GaN/sapphire wafer after a MOCVD process.
Figure 4A:
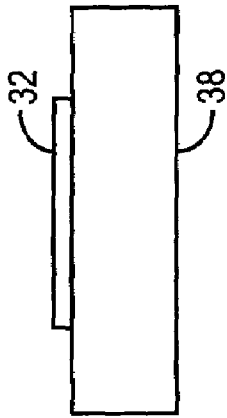
FIG. 4A is a schematic diagram illustrating a GaN/sapphire wafer during a MOCVD process.
Figure 5A:
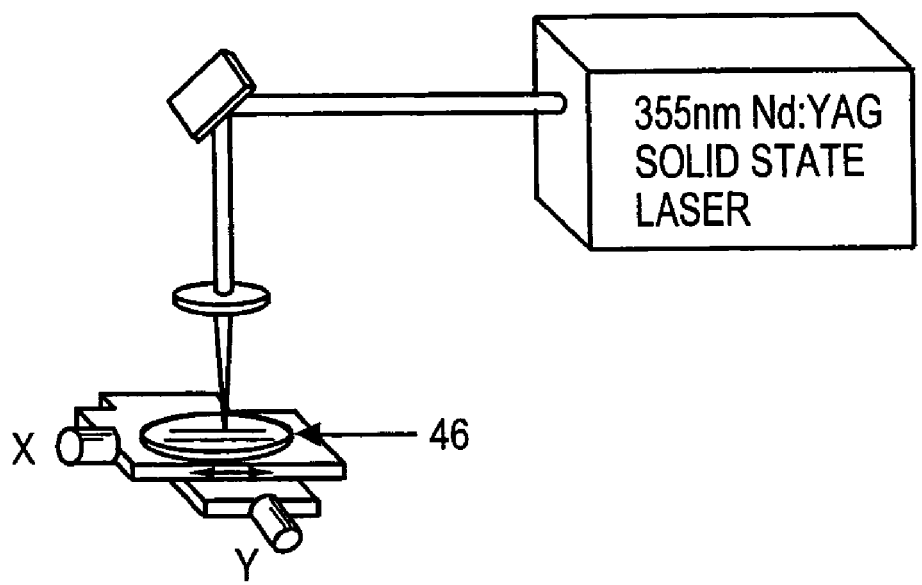
FIG. 5A is a schematic diagram illustrating a conventional method of laser lift-off on a GaN/sapphire wafer using a Q-switched 355 nm Nd:YAG laser.
Figure 5B:
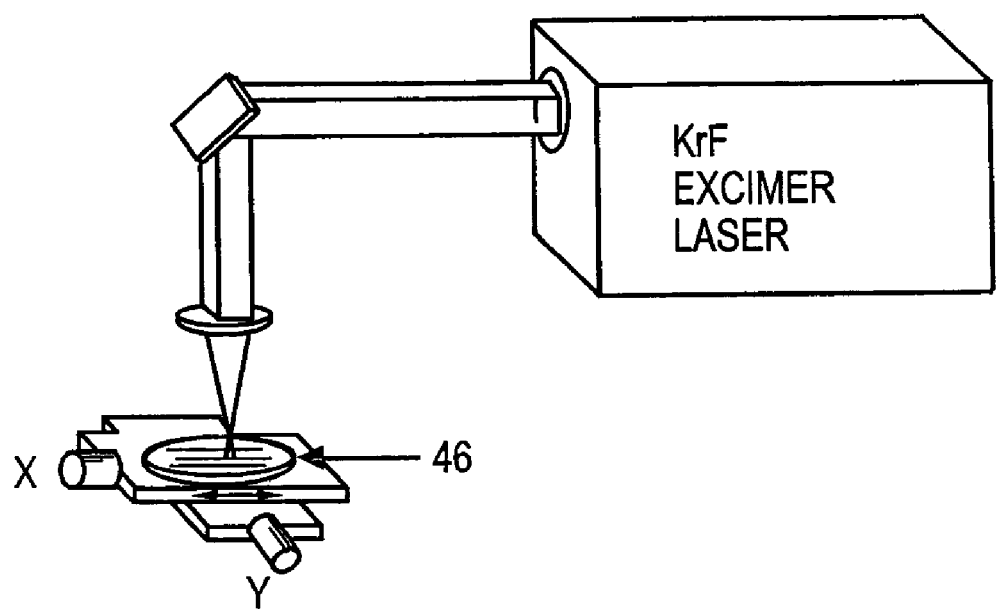
FIG. 5B is a schematic diagram illustrating a conventional method of laser lift-off on a GaN/sapphire wafer using a 248 nm excimer laser.
Figure 6:
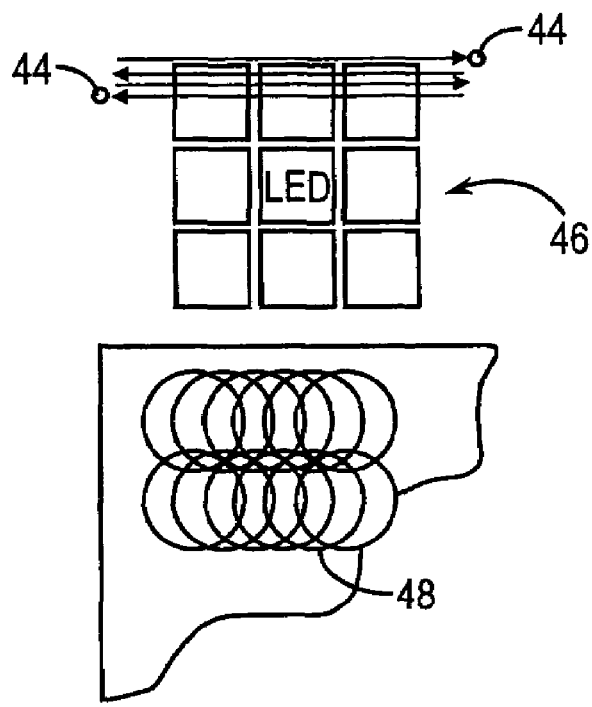
FIG. 6 is a schematic diagram illustrating raster scanning of a Q-switched 355 nm Nd:YAG laser on a GaN/sapphire LED wafer and the resulting multiple exposures.
Figure 7:
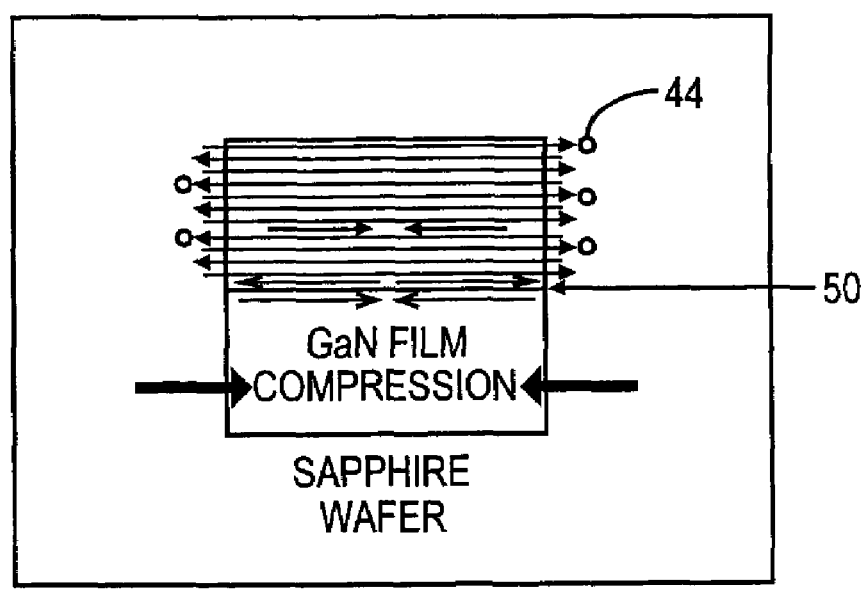
FIG. 7 is a schematic diagram illustrating raster scanning on a GaN/sapphire LED wafer and the resulting stresses, which create a high probability of Mode I and II cracks at the interface.
Figure 8:
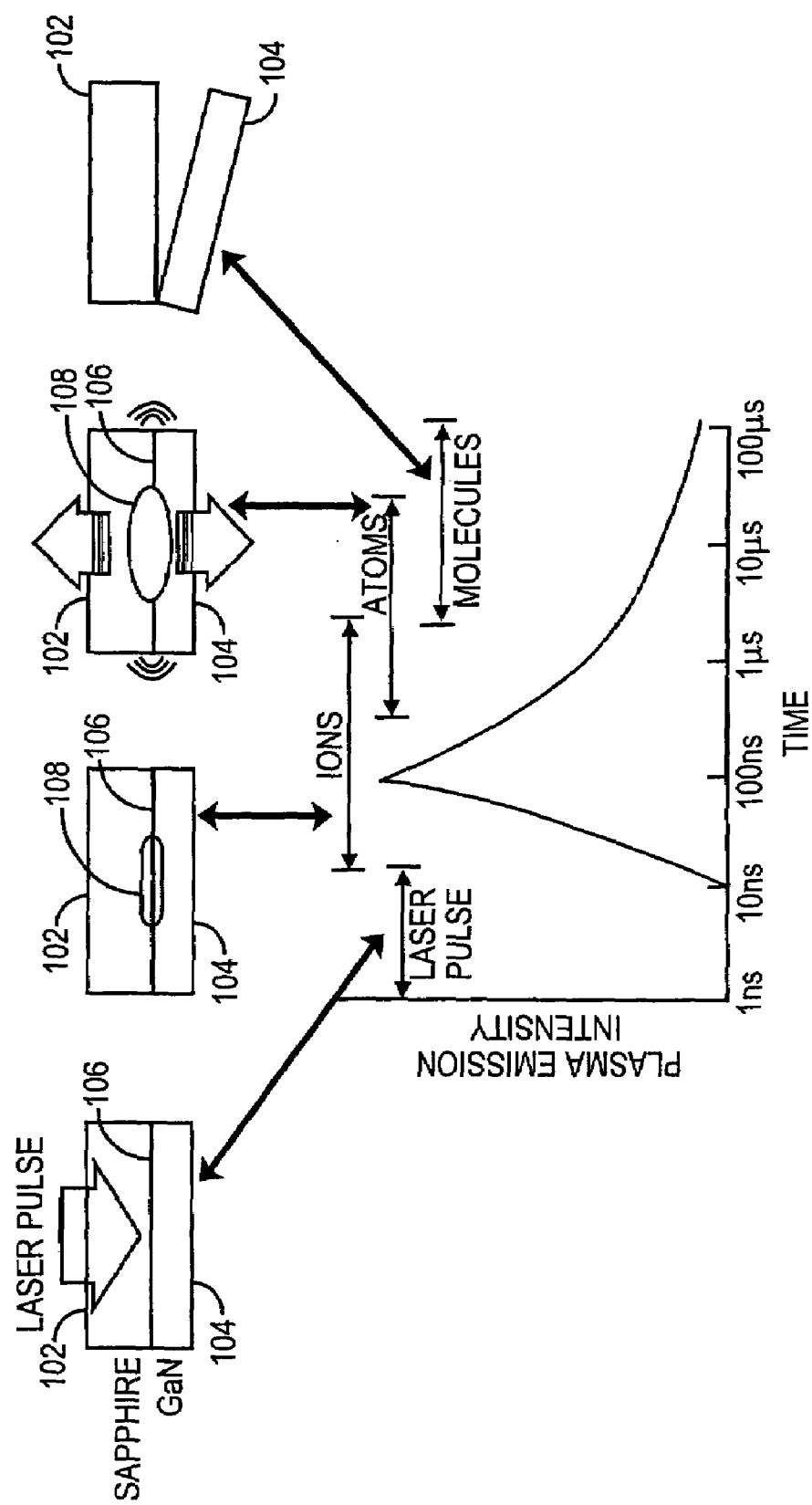
FIG. 8 is a schematic diagram of the use of a laser pulse to induce a shock wave for separating layers, consistent with one embodiment of the present invention.

Referring to FIG. 8, a laser may be directed through at least one layer of substrate material 102 to at least one target material 104 to separate the materials 102, 104. In the exemplary embodiment, the substrate material 102 is sapphire and the target material 104 is gallium nitride (GaN). The separation of the materials 102, 104 may be achieved by using a laser energy density sufficient to induce a shock wave at the interface 106 of the target material 104 and the substrate material 102, thereby instantaneously debonding the target material 104 from the substrate material 102. The shock wave may be created by the explosive expansion of plasma 108 at the interface as a result of the increased density of the ionized vapor sharply elevating the plasma temperature. The laser energy density may be in a range sufficient to induce a force $F_a$ on the target material 104 that causes separation without fracturing. The applied force $F_a$ may be represented as follows:

$$P_p(GPa) = C[I_r(GW/cm^2)]^{1/2}$$

$$F_a(N) = P_p(GPa)A_r(cm^2)$$

where $P_p$ is the peak pressure induced by explosive shock waves, C is an efficiency and geometrical factor, $I_r$ is the irradiance of the incident laser beam, $F_a$ is the applied force and $A_r$ is the area under irradiation.

When the plasma 108 is expanding, as shown in FIG. 9, the laser exposed area is acting as a bending arm pivoting at the edge of the laser exposed area. For example, the force ($F_r$) required for rupturing or fracturing may be viewed as a two-point bend test and may be represented as follows:

$$F_r \propto \frac{wd^2}{L}\sigma_r$$

where d is the thickness of the target material 104, w is the width of the applied force or width of the laser pulse, L is the length of applied arm or half length of the laser pulse, and $\sigma_r$ is the modulus of rupture or fracture stress of GaN. To increase the force ($F_r$), the width w of the laser pulse may be increased and the half length L of the laser pulse may be decreased, thereby forming a line shaped beam. The line shaped beam may be scanned across the target material 104 to minimize the bending moment upon irradiation.

At a laser energy density under the ablation threshold of GaN (~0.3 J/cm² at 248 nm), for example, the instantaneous separation of the GaN/sapphire interface 106 may not be successfully achieved, as shown in FIG. 10A. Although decomposition of the GaN can occur under the ablation threshold, this alone cannot achieve instantaneous separation of the interface 106, because there is no driving force, i.e. shock waves from the expanding plasma, without the ablation. Conversely, applying overly-intense laser energy density may create excessive explosive stress wave propagation, which results in cracks and fractures on the target material 104 (e.g., the GaN film), as shown in FIG. 10C. When the irradiating laser energy density is optimized, as shown in FIG. 10B, the force created by the shock wave is sufficient to separate the layers 102, 104 at the interface 106 but not enough to induce fracture in the target material 104. According to one exemplary embodiment with GaN and sapphire, the optimum range of laser energy density may be between about 0.60 J/cm² to 1.5 J/cm².

The parameters of the laser irradiation, such as the wavelength and energy density, depend on the types of materials being separated. For example, the optimum laser energy density for separating GaN from sapphire is discussed above. A laser wavelength of 248 nm is also desirable for separating GaN from sapphire. It is well known to those skilled in the art that the photonic energy of 248 nm (5 eV) is between the bandgaps of GaN (3.4 eV) and sapphire (9.9 eV). This indicates that the 248 nm radiation is better absorbed in GaN than in sapphire and the selective absorption causes the ablation resulting in separation.

Those skilled in the art will recognize that other laser wavelengths may be used to separate other types of materials. For example, a buffer layer may be used between the sapphire substrate and the GaN layer(s) to facilitate epitaxial growth of the GaN. Examples of the buffer layer include a GaN buffer layer and an Aluminum Nitride (AlN) buffer layer. Where an AlN buffer layer is used, a laser at 193 nm may be used because the photonic energy of the 193 nm laser light (6.4 eV) is in between bandgaps of sapphire (9.9 eV) and AlN (6.1 eV).

Figure 11:
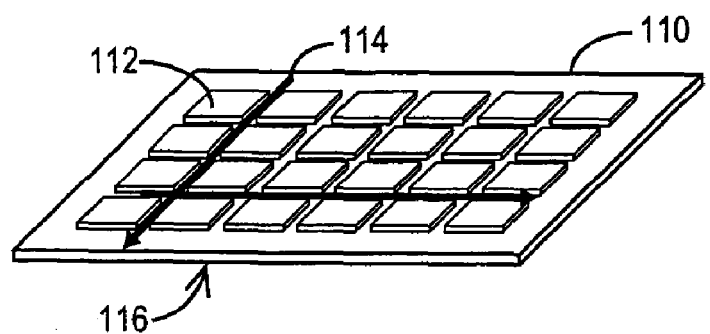
FIG. 11 is a schematic diagram of a wafer illustrating selective ablation of GaN layers on streets to separate the GaN layers into a plurality of dies, leaving the sapphire wafer intact, consistent with one embodiment of the present invention.

According to one embodiment of the present invention, as shown in FIG. 11, one or more of the layers to be separated (e.g., the GaN film or layers) may be formed into smaller areas or sections 112 before lift-off or separation from a substrate 110 such as a sapphire wafer. In one embodiment, the sections 112 may be segregated, for example, to correspond to LED dies. The formation of sections 112 reduces fractures induced by residual stresses and shock waves at the interface during a lift-off process. The sections 112 of GaN film are less influenced by induced residual stresses from its surroundings. Furthermore, the sections 112 have an insignificant amount of residual stresses and strains, which the thin GaN film in these sections 112 can withstand.

According to one example, a GaN/sapphire LED wafer 116 contains symmetric and repeating patterns of sections 112 to form the same-sized LED dies, which are generally in a few hundreds of microns of square or rectangular size. The symmetrical and repeating sections 112 may be separated by streets 114, for example, which determine borders for the LED dies and provide sacrificial spaces for die separation, for example, using a scribe and break process. Although the sections 112 in the exemplary embodiment correspond to individual square-shaped dies, those skilled in the art will recognize that other configurations and shapes, such as rectangular shapes, may be formed.

The GaN film can be separated into sections 112 through selectively removing or etching of GaN layer(s) on the streets 114. One method of selectively removing GaN layer(s) on the streets 114 is through reactive ion etching, which is generally known to those skilled in the art. This process has a few drawbacks, including slow etch rate and the requisite handling of hazardous chemicals. Another method includes the selective etching by a solid state UV laser with a variable astigmatic focal beam spot formed by an anamorphic beam delivery system, as disclosed in U.S. patent application Ser. No. 10/782,741, which is fully incorporated herein by reference. The variable astigmatic focal beam spot can effectively adjust its size to an optimum laser energy density, which selectively ablates GaN layer(s) on the streets 114, leaving the sapphire substrate unaffected (see FIG. 11). This selective GaN ablation utilizes the large difference in ablation threshold between GaN (0.3 J/cm² at 248 nm) and sapphire (over 2 J/cm² at 248 nm).

According to another method, the etching can be performed using a patterned laser projection (e.g., using an excimer laser). A patterned excimer laser beam can also be used to dry pattern the GaN streets or the devices into shapes or to pattern other thin films such as ITO, metallization, or dielectric insulation layers, or for other devices or conductive or insulator layers. As an alternative to removing portions of a continuous GaN film to form the sections 112 and streets 114, the GaN can be formed (e.g., grown) on the substrate 110 as sections 112 and streets 114. The growth of the continuous GaN film, however, may be more economical as compared to the growth of GaN layers with patterns of streets 114 and sections 112.

According to a further method, the streets 114 between the sections 112 may be widened, for example, using reactive ion etching, after the substrate 110 has been removed. Re-etching the streets 114 may reduce or eliminate the possibility of current leakage at the side walls of the sections 112, for example, at the n-GaN and p-GaN junction.

A lift-off process may be used to separate the sections 112 (e.g., the GaN layer(s)) from the substrate 110 (e.g., the sapphire wafer) by irradiating an interface between the substrate 110 and the sections 112. The exemplary laser lift-off process may use a single-pulse process with a homogeneous beam spot and an energy density sufficient to induce a shock wave as described above. The single pulse process avoids overlapping exposures at the interface between the substrate 110 and the sections 112 and thus minimizes fracturing. The homogeneous beam spot may be used to irradiate the interface between layers being separated to substantially eliminate the density gradient, thereby facilitating effective lift-off. Both UV solid state lasers and excimer lasers can be used with a beam homogenizer to generate a homogenous beam spot for the lift-off process. One exemplary embodiment uses a KrF excimer laser at 248 nm. The gaseous laser medium with electrical discharge generates high average power with a large raw beam size. The application of the beam homogenizer is very effective with the large and powerful raw beam of the excimer laser. Also, providing an evenly-distributed laser energy density in a beam spot advantageously creates effective lift-off in the area with the single pulse irradiation.

Figure 12:
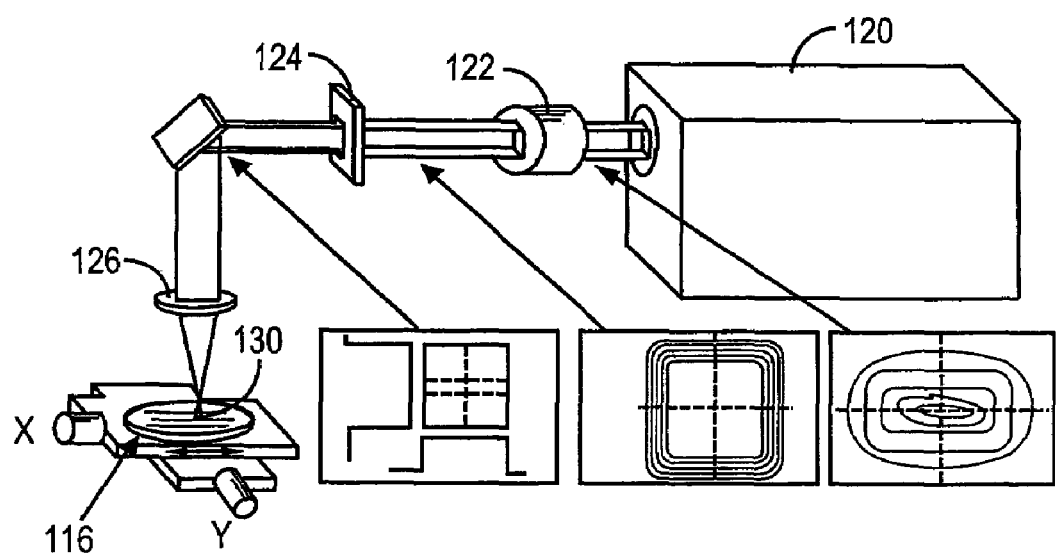
FIG. 12 is a schematic diagram of a beam delivery system illustrating the projection of a homogeneous beam and representative beam profile shown along the beam path, consistent with another embodiment of the present invention.

FIG. 12 illustrates one example of a projection of a homogeneous beam by near-field imaging and shows a representative beam profile along the beam path. The raw beam from an excimer laser 120 has Gaussian distribution in short sided/flat topped distribution in the long side. The beam homogenizer 122 (e.g., of multi-array configuration) makes the gradient raw beam profile into a square flat-topped profile. The homogenized beam is cropped by the mask 124 (e.g., the rectangular variable aperture) to utilize the best portion of the beam, which is projected to the LED target wafer 116 by near-field imaging, for example, using beam imaging lens 126. The edge resolution of the homogeneous beam spot 130 at the LED wafer 116 therefore becomes sharp. Although one configuration for the beam delivery system is shown in this exemplary embodiment, those skilled in the art will recognize that other configurations may be used to create and project the homogeneous beam. Although the exemplary embodiment shows a mask 124 with a rectangular aperture, any shape of mask can be used for near field imaging.

Figure 13:
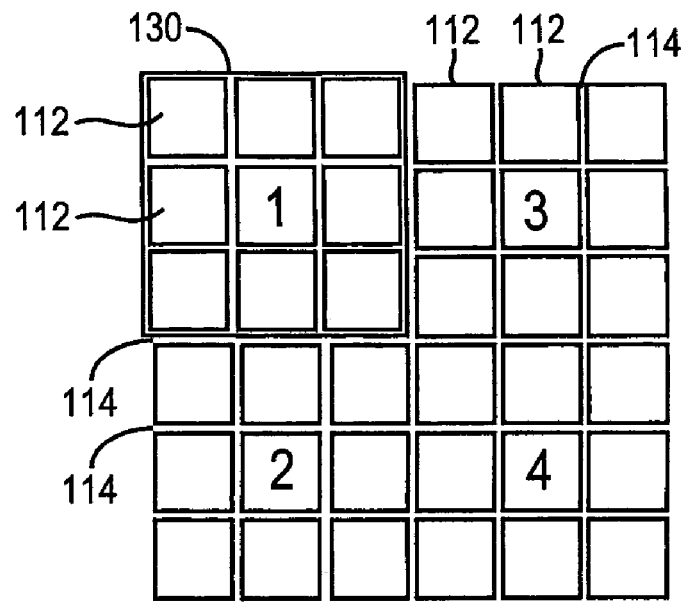
FIG. 13 is a schematic diagram of a wafer illustrating laser lift-off exposure using a step and repeat process, consistent with a further embodiment of the present invention.
Figure 14:
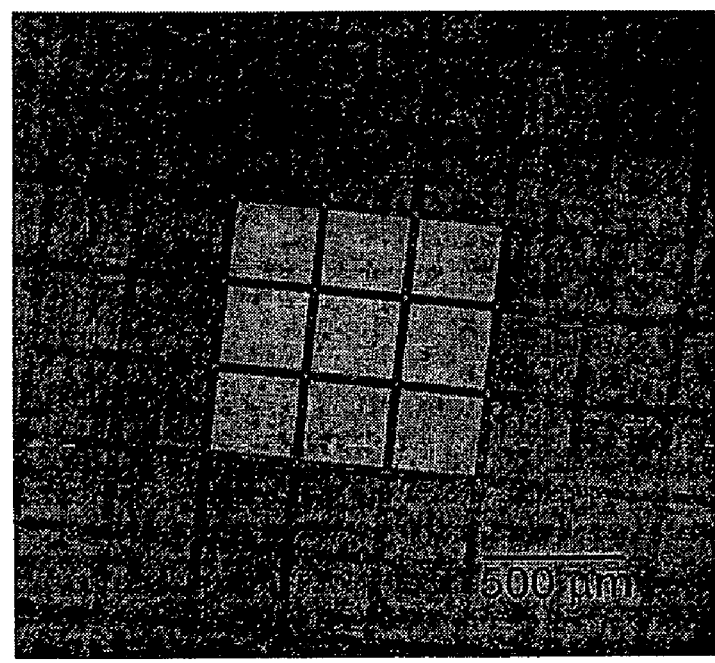
FIG. 14 is a photograph of a wafer illustrating a single pulse exposure on a three-by-three LED array using the step and repeat lift-off process.

According to one exemplary method, the lift-off exposure is performed using a step and repeat process. The homogenized beam spot 130 is shaped to include an integer number of segregated sections 112 (e.g., corresponding to an integer number of LED dies), as shown in FIG. 13. The size of the beam spot 130 is precisely shaped, based on the size of segregated sections 112, to include multiple segregated sections 112, such as a three-by-three array. The interface between the substrate and the integer number of sections 112 may be irradiated using a single pulse exposure, and the process may be repeated for each group of sections (i.e., dies). The numbering in FIG. 13 shows an exemplary sequence for the step and repeat process. As the irradiation is repeated for each group of sections 112, stitching of the beam spot 130 may be performed. Advantageously, the stitching may be performed within the streets 114 to avoid possible damages in the active LED area. In the exemplary process, the stitching of the beam spot 130 is kept within about 5 μm FIG. 14 illustrates an example of a single-pulse exposure on an LED lift-off wafer by 248 nm excimer laser. In FIG. 14, the homogenized beam spot is covering nine (9) LED dies and the debonded GaN/sapphire interface appears brighter.

Due to its precisely controlled exposure with a single pulse in a small area, the exemplary laser lift-off exposure does not require heating of the LED wafer to offset the residual stresses. Exposure may be performed at room temperature. Because the laser light of the lift-off exposure travels through the sapphire wafer, damage or debris on the surface of the sapphire can make shadows at the GaN/sapphire interface, causing defects on the lift-off interface. The surface of the sapphire may be polished to remove any debris or particles. The lift-off exposure may also be applied to the target in a range of different angles, which will reduce or eliminate shadowing effects.

The exemplary processes discussed above can improve the productivity and yield of the UV-laser lift-off process for successful industrial applications. An exemplary method consistent with the present invention combines the segregation of residual stress on a LED wafer and the homogenous beam laser exposure. The selective etching of GaN layers on streets isolates the film into small areas, which have minimal influence by residual stresses from its surroundings. In addition, the small areas themselves have minimal residual stresses, which will hardly affect the GaN film upon lift-off exposure. The homogenized beam delivers substantially uniform laser energy density in the spot. The precise laser exposure with a homogenized laser beam allows the proper lift-off with optimum laser energy density.

Figure 15:
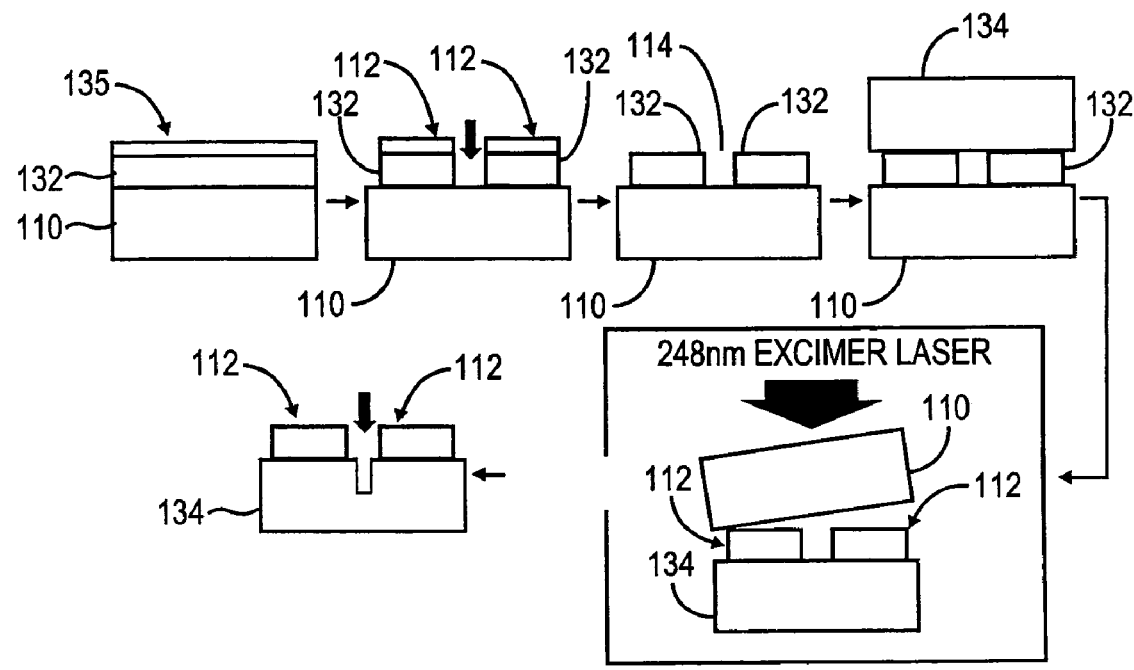
FIG. 15 is a diagram illustrating a laser lift-off process, combining the segregation of residual stress and precision step-and-repeat laser beam exposure, consistent with yet another embodiment of the present invention.

FIG. 15 illustrates an exemplary lift-off process. After one or more GaN layer(s) 132 are grown on a sapphire substrate 110, a protection coating 135 can be applied to prevent deposition of laser generated debris on the GaN layer(s) 132 in the wake of laser scribing. The selective removal of the GaN layer(s) 132 to form streets 114 and sections 112 can be done by laser scribing or by reactive ion etching. A conductive substrate 134 is bonded on the GaN layers 132, after the protection coating 135 is removed. The conductive substrate 134 can be any type of conductive ceramics and metals, including but not limited to, Si, Ge, GaAs, GaP, Copper, Copper Tungsten and Molybdenum. A reflective layer (not shown) may also be formed between the GaN layer(s) 132 and the conductive substrate 134. Then, the sapphire substrate 110 can be removed by the laser lift-off process. After the laser lift-off, the GaN surface can be treated for deposition of electrode metal film or other necessary steps. Finally, the wafer can be separated between the sections 112, for example, to form individual LED dies.

Figure 16:
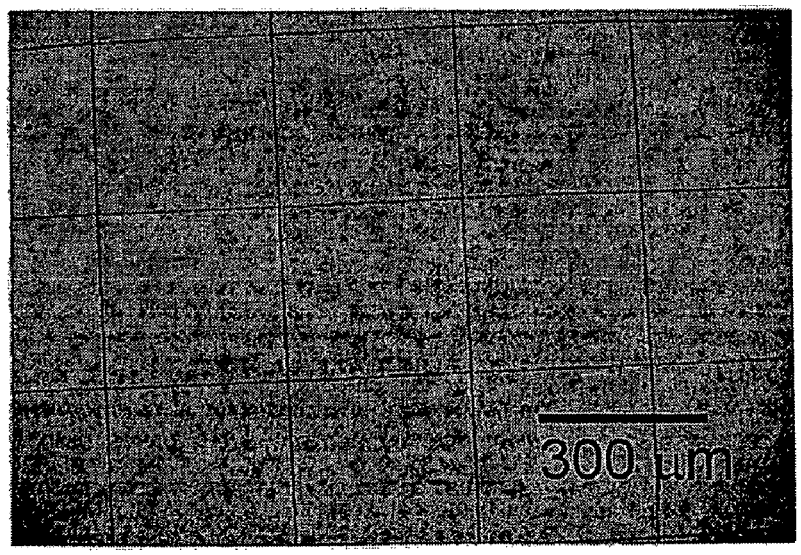
FIG. 16 is a photograph of a wafer illustrating selective removal of GaN by a solid state UV laser with a variable astigmatic focal beam spot.

An example of the selective removal of the GaN layer on an actual wafer is shown in FIG. 16, where a solid state UV laser providing a high speed laser cut with a variable astigmatic focal beam spot was used for the GaN removal. In this example, monolithic GaN layers, which contain no die or street pattern, were grown on a sapphire wafer initially. The LED die size is defined by the lines cut by the laser. In the example, the width of selective removal or laser cuts is only about 5 μm, which minimizes the loss of the wafer real estate.

Among the conductive substrates for the lift-off, Molybdenum has desirable properties, such as matching coefficient of thermal expansion (CTE), high reflectivity in blue spectra and high strength with low ductility. Molybdenum has a CTE ($4.8 \times 10^{-6}$/K) that is relatively close to that of GaN ($5.6 \times 10^{-6}$/K). Metal compounds, such as PdIn and SnAu, may be used for the bonding of the conductive substrates on GaN. When using these bonding materials, the GaN and the substrate is heated, for example, up to around 400 C.°. A large mismatch of CTE between the GaN layers and the lift-off substrate may introduce another high level of residual stresses, which are detrimental to the bonding process. For example, although Cu has great thermal and electrical conductivity, it is not as desirable as a lift-off substrate with a 2 inch GaN/sapphire wafer because of its high CTE ($16.5 \times 10^{-6}$/K).

Molybdenum has reflectivity of about 55% in the blue spectral region, ranging from 350 nm to 450 nm. This value is comparable to other metals. For instance, the reflectivity values of major metals at 410 nm are as follows: gold (37%), copper (51%), Nickel (50%), platinum (57%), iron (58%), chromium (70%), silver (86%), aluminum (92%). Although the comparable reflectivity allows molybdenum to be directly used as a reflector (i.e., without a separate reflective layer), the light output can be maximized by deposition of a metal film with high reflectivity, such as aluminum and silver. A highly reflective film layer between GaN and molybdenum can increase the performance of a blue LED, for example, without introducing a high level of residual stresses. For example, aluminum can be deposited by sputtering on the GaN surface to form the reflective layer. Since the oxidation of aluminum film is detrimental to the bonding to the molybdenum substrate, another layer of metallic film can be deposited to prevent the oxidation and enhance the bonding. Examples of metallic films that do not oxidize and that will allow the molybdenum to adhere to the aluminum film include, but are not limited to, tin, zinc, lead and gold.

Molybdenum also provides advantages during the die separation process. Conventional diamond saw or diamond scribing are difficult to use for separation of a metal film, mainly due to its high ductility. Laser cutting and scribing is an alternative method for die separation. However, a metal film with high ductility, such as copper, requires 100% through cut for the separation, because the mechanical breaking is difficult on ductile substrates. Thus, the laser through-cut raises handling issues because it may not maintain the integrity of small dies after the cut. Molybdenum has high strength and low ductility. These unique mechanical properties of molybdenum facilitate the mechanical breaking, even when it is laser-scribed for about 90% of its thickness.

According to another exemplary method, a laser lift-off exposure may be combined with a technique of high speed motion control to maximize productivity. When the laser lift-off utilizes the step-and-repeat exposure with precisely designed beam stitching, it is desirable for the triggering of the laser to be accurate on the target. The fastest possible speed of the step-and-repeat process is also desirable to increase productivity. A special function of motion control can be used to compare the position of the motion stages and send a trigger signal to the laser at predetermined positions. The technique is referred to as 'position compare and trigger' or 'fire on fly.' While motion stages are in continuous motion, a processor in a motion controller is constantly comparing an encoder counter to user programmed values, and sending out trigger signals to a laser with matching values. Thus, the motion stages do not need to stop for the step and repeat, but may move in continuous motion, i.e., the laser fires on fly. For example, when the lift-off process utilizes a fire on fly technique, the homogeneous beam spot size of $1 \times 1$ mm$^2$, with pulse repetition rate of a laser at 200 Hz, can perform the lift-off process of 2 inch diameter LED wafer within about a minute.

Although the exemplary embodiments involve forming the streets 114 and sections 112 before performing the lift-off process, the techniques described herein may also be used to separate continuous layers without first segregating a layer into sections. Although effective separation of continuous layers is possible, there may be micro-cracks formed where the laser pulses overlap.

Other exemplary methods may use unique techniques to scan the laser beam for the lift-off exposure, for example, to irradiate in a concentric pattern. These techniques may be used to perform lift-off of one or more segregated layers or one or more continuous layers on a substrate. The residual stresses in a GaN/sapphire LED wafer have a concentric distribution, where tension and compression exist together. The laser exposure, when crossing the wafer center, may cause large differences in the stress level at the interface between the separated and un-separated regions, i.e., the interface between the scanned and the un-scanned area. According to different methods, the beam may be scanned with a circular, spiral or helical exposure to relax the residual stresses along with locations at the same level of stresses. This method reduces the stress gradient at the interface between scanned and unscanned areas. Alternatively, a line beam with dimensions to minimize bending moment upon irradiation may be scanned across the interface, as discussed above.

Figure 17:
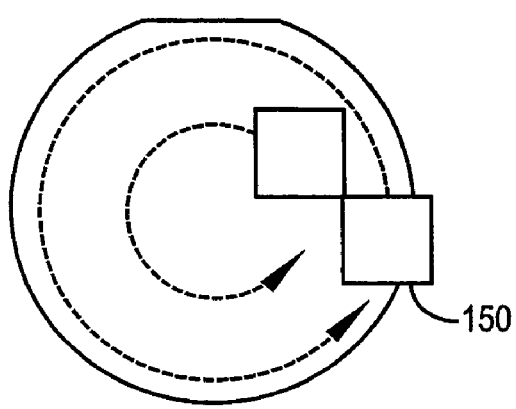
FIG. 17 is a schematic diagram illustrating concentric or helical laser lift-off exposure with a square beam, consistent with a further embodiment of the present invention.
Figure 18:
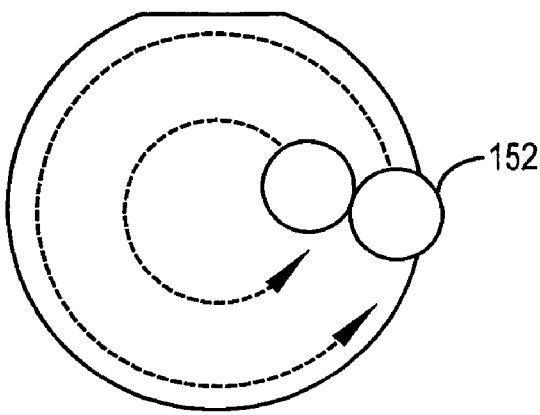
FIG. 18 is a schematic diagram illustrating concentric or helical laser lift-off exposure with a circular beam, consistent with a further embodiment of the present invention.

FIG. 17 shows a concentric lift-off exposure with a square beam spot 150. FIG. 18 shows a concentric lift-off exposure with a circular beam 152. In one method, the laser beam is stationary while the wafer is translated concentrically (e.g., in a circular or helical pattern) for the exposure. According to another method, the beam may be moved (e.g., in a circular or helical pattern) on a stationary wafer.

One way to move the circular beam is using galvanometer scanners, which precisely control two mirrors in motion by rotary motors. Other beam spot shapes known to those skilled in the art may also be used, such as triangular, hexagonal or other polygon shapes. In the case of a polygon shaped laser pattern irradiating a polygon shaped die, the beam may be moved in a circular or spiral motion to overlay the die or groups of die and provide separation of the film from the substrate in a controlled pattern to relieve stresses in a controlled way.

Figure 19:
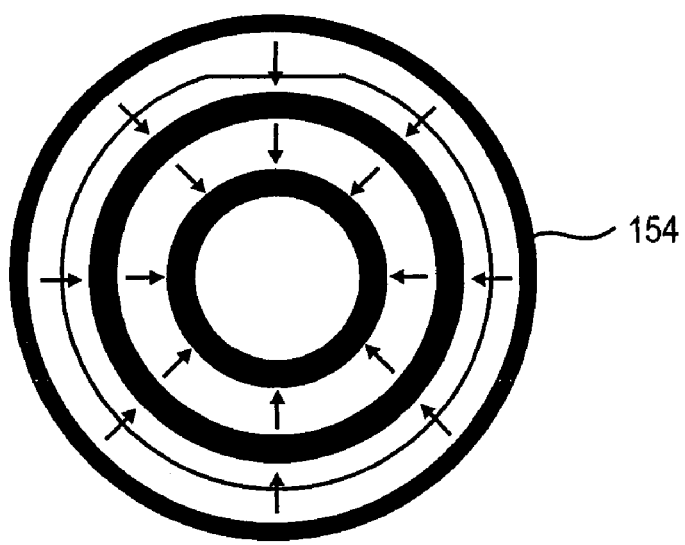
FIG. 19 is a schematic diagram illustrating concentric laser lift-off exposure with a variable annular beam, consistent with a further embodiment of the present invention.

Another alternative achieves the concentric scanning using a variable annular beam spot. As shown in FIG. 19, the variable annular beam spot 154 gradually reduces its diameter to concentrically scan from outer edges to the center of the wafer. The variable annular beam spot can be achieved by an incorporation of two conical optics into the beam delivery system (BDS), where the distance between the two optics determines the diameter of the spot. Using this annular beam spot moving concentrically provides stable relaxation of the residual stresses upon the laser lift-off exposure.

FIG. 20 illustrates a laser lift off process for separating an electroplated substrate, consistent with a further embodiment. A sapphire wafer or substrate 110 with sections 112 of GaN formed thereon may be electroplated with a metal or metal alloy to form a metal substrate 160. Nickel or copper, or alloys thereof, may be used for electroplating. The metal substrate 160 may then be cut at locations 162 between the sections 112, for example, using a UV laser. A supporting film 164 may be mounted on the metal substrate 160, and a laser lift-off process such as described above may then be used to separate the sapphire substrate 110. Post laser lift-off processes such as contact metallization may then be used to remove portions of the metal substrate 160 to form dies 166. The dies 166 may then be separated. By cutting the metal substrate 160 prior to laser lift-off, the integrity of the dies 166 can be maintained because of the bonding to the sapphire substrate 110. Those skilled in the art will recognize that this process may also be performed using other materials.

In summary, according to a method consistent with one aspect of the present invention, first and second substrates are provided with at least one layer of material between the substrates, the layer of material being segregated into a plurality of sections separated by streets. A beam spot is formed using a laser and shaped to cover an integer number of the sections. An interface between the first substrate and the sections is irradiated using the beam spot. The irradiating is performed repeatedly for each integer number of the sections until the first substrate is separated from all of the sections.

According to another method, a substrate is provided having at least one layer of material formed thereon and a homogenous beam spot is formed using at least a laser and a beam homogenizer. An interface between the layer and the substrate is irradiated with substantially evenly-distributed laser energy density using a single pulse of the homogeneous beam spot to separate the layer from the substrate.

According to yet another method, a substrate is provided having at least one layer of material formed thereon and a beam spot is formed using a laser. An interface between the first substrate and the layer is irradiated using the beam spot. The interface is irradiated in a generally concentric pattern to separate the layer from the substrate.

According to a further method, a first substrate is provided having at least one layer of material formed thereon and the layer(s) of material are etched to segregate the layer(s) into a plurality of sections separated by streets on the first substrate. A second substrate is attached to the sections and a homogenous beam spot is formed using a laser. The homogeneous beam spot is shaped to cover an integer number of the sections. An interface between the first substrate and the sections is irradiated using the homogeneous beam spot. The irradiating is performed repeatedly for each integer number of the sections. The first substrate is separated from all of the sections.

According to yet another method, a first substrate is provided having at least one layer of GaN formed thereon and at least one film is formed on the GaN layer. The film may include a reflective film. A second substrate including Molybdenum is attached to the film and an interface between the first substrate and the GaN layer is irradiated to separate the first substrate from the layer of GaN.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art considered to be within the scope of the present invention, which is not to be limited except by the following claims.

What is claimed is:

1. A method of separating at least one layer of material from a substrate, said method comprising:
   providing a substrate having at least one layer of material formed thereon;
   forming a homogenous beam spot using at least a laser and a beam homogenizer; and
   irradiating an interface between said layer and said substrate with substantially evenly-distributed laser energy density using a single pulse of said homogeneous beam spot to separate said layer from said substrate, wherein irradiating said interface includes moving said substrate with said layer in a generally circular direction.

2. The method of claim 1 wherein forming said homogeneous beam spot includes passing a raw beam through said beam homogenizer and then through a variable aperture.

3. The method of claim 2 wherein said variable aperture has a generally rectangular shape.

4. The method of claim 1 wherein said laser includes an excimer laser.

5. The method of claim 1 wherein said laser energy density of said homogeneous beam spot is sufficient to induce a shock wave at said interface, wherein said shock wave separates said first substrate from said layer of material.

6. The method of claim 1 wherein said layer is segregated into an array of dies on said substrate.

7. The method of claim 1 wherein irradiating said interface includes exposing said interface to laser light at a range of angles with respect to said interface.

8. The method of claim 1 wherein said substrate is a sapphire wafer, and wherein said at least one layer of material includes at least one layer of GaN.

9. The method of claim 8 wherein said at least one layer further includes a GaN buffer layer.

10. The method of claim 9 wherein said homogeneous beam spot is formed using a 248 nm excimer laser.

11. The method of claim 9 wherein said at least one layer further includes an AlN buffer layer.

12. The method of claim 11 wherein said homogeneous beam spot is formed using a 193 nm excimer laser.

13. The method of claim 1 wherein said laser energy density is in a range of about 0.60 J/cm$^2$ to 1.6 J/cm$^2$.

14. A method of separating at least one layer of material from a substrate, said method comprising:
   providing a substrate having at least one layer of material formed thereon;
   forming a beam spot using a laser; and
   irradiating an interface between said first substrate and said layer using said beam spot, wherein said interface is irradiated in a generally concentric pattern to separate said layer from said substrate, wherein said beam spot is a variable annular beam spot, and wherein a diameter of said variable annular beam spot is reduced to concentrically scan said interface between said first substrate and said layer.

15. The method of claim 14 wherein said beam spot is a homogenous beam spot.

16. The method of claim 14 wherein said laser includes an excimer laser.

17. The method of claim 14 wherein said layer is segregated into an away of dies on said substrate.

18. The method of claim 14 wherein said substrate is a sapphire wafer, and wherein said at least one layer of material includes at least one layer of GaN.

19. The method of claim 18 wherein said at least one layer further includes a GaN buffer layer.

20. The method of claim 19 wherein said beam spot is formed using a 248 nm excimer laser.

21. The method of claim 18 wherein said at least one layer further includes an AlN buffer layer.

22. The method of claim 21 wherein said beam spot is formed using a 193 nm excimer laser.

23. The method of claim 14 wherein said interface is irradiated with a laser energy density in a range of about 0.60 J/cm$^2$ to 1.6 J/cm$^2$.

* * * * *

UNITED STATES PATENT AND TRADEMARK OFFICE
CERTIFICATE OF CORRECTION

PATENT NO. : 7,241,667 B2 Page 1 of 1
APPLICATION NO. : 11/215248
DATED : July 10, 2007
INVENTOR(S) : Park et al.

It is certified that error appears in the above-identified patent and that said Letters Patent is hereby corrected as shown below:

In column 15, line 2, in Claim 17, delete "away" and insert -- array --, therefor.

Signed and Sealed this

First Day of April, 2008

JON W. DUDAS
*Director of the United States Patent and Trademark Office*